(12) United States Patent
Taylor et al.

(10) Patent No.: US 7,022,216 B2
(45) Date of Patent: *Apr. 4, 2006

(54) ELECTROLYTIC ETCHING OF METAL LAYERS

(75) Inventors: E. Jennings Taylor, Troy, OH (US); Heather Dyar, Kettering, OH (US)

(73) Assignee: Faraday Technology Marketing Group, LLC, Troy, OH (US)

( * ) Notice: Subject to any disclaimer, the term of this patent is extended or adjusted under 35 U.S.C. 154(b) by 320 days.

This patent is subject to a terminal disclaimer.

(21) Appl. No.: 10/459,105

(22) Filed: Jun. 11, 2003

(65) Prior Publication Data

US 2004/0004006 A1    Jan. 8, 2004

Related U.S. Application Data

(60) Provisional application No. 60/387,577, filed on Jun. 12, 2002.

(51) Int. Cl.
*C25C 3/04* (2006.01)
*C25C 3/18* (2006.01)

(52) U.S. Cl. ............... 205/658; 205/654; 205/659; 205/686

(58) Field of Classification Search ......... 205/658–659
See application file for complete search history.

(56) References Cited

U.S. PATENT DOCUMENTS 4,125,444 A * 11/1978 Inoue ..................... 205/643

(Continued)

FOREIGN PATENT DOCUMENTS

SU            1440636 A1 * 11/1988

OTHER PUBLICATIONS

Penner et al., "Preparation and Electrochemical Characterization of Ultramicroelectrode Ensembles," 1987, Anal. Chem., 59, 2625-2630.*

(Continued)

*Primary Examiner*—Roy King
*Assistant Examiner*—Michael P. Alexander
(74) *Attorney, Agent, or Firm*—Thompson Hine LLP

(57) ABSTRACT

A method for selectively removing a layer of electrolytically dissoluble metal such as copper overplate from a substrate such as a low-k dielectric comprising:
  providing a substrate bearing on a major surface thereof a layer of electrolytically dissoluble metal, the metal layer serving as a dissoluble electrode and having a central region and an adjacent peripheral region;
  providing at least a first counterelectrode and a second counterelectrode;
  positioning the counterelectrodes opposite the metal layer and spaced from the metal layer and spaced from each other;
  in a first electrolytic step, passing an electric current between the first counterelectrode and the central region of the metal layer, wherein the first counterelectrode is cathodic with respect to the metal layer, and the first electrolytic step includes a first phase, a second phase, and a third phase and during the first phase the electric current is a low amperage current, during the second phase the electric current includes a train of anodic pulses having a short on time and a higher amperage than during the first phase, and during the third phase the current includes a train of higher amperage anodic pulses having a longer on time than the second phase or is DC current; and
in a second electrolytic step, passing an electric current between the second counterelectrode and the peripheral region of the metal layer, wherein the second counterelectrode is maintained cathodic to the metal layer, and the second electrolytic step includes a first phase, a second phase, and a third phase.

29 Claims, 16 Drawing Sheets

U.S. PATENT DOCUMENTS

| | | | |
|---|---|---|---|
| 5,599,437 A | 2/1997 | Taylor et al. | |
| 5,804,057 A | 9/1998 | Zhou et al. | |
| 6,080,504 A | 6/2000 | Taylor et al. | |
| 6,203,684 B1 | 3/2001 | Taylor et al. | |
| 6,210,555 B1 | 4/2001 | Taylor et al. | |
| 6,214,200 B1 * | 4/2001 | Altena et al. | 205/652 |
| 6,221,235 B1 | 4/2001 | Gebhart | |
| 6,231,748 B1 | 5/2001 | Agafonov et al. | |
| 6,248,222 B1 | 6/2001 | Wang | |
| 6,303,014 B1 | 10/2001 | Taylor et al. | |
| 6,309,528 B1 | 10/2001 | Taylor et al. | |
| 6,315,883 B1 | 11/2001 | Mayer et al. | |
| 6,319,384 B1 | 11/2001 | Taylor et al. | |
| 6,395,152 B1 | 5/2002 | Wang | |
| 6,402,931 B1 | 6/2002 | Zhou et al. | |
| 6,440,289 B1 | 8/2002 | Woo et al. | |
| 6,440,295 B1 | 8/2002 | Wang | |
| 6,447,668 B1 * | 9/2002 | Wang | 205/645 |
| 6,524,461 B1 | 2/2003 | Taylor et al. | |
| 6,551,485 B1 | 4/2003 | Taylor | |
| 6,558,231 B1 | 5/2003 | Taylor | |
| 2002/0153246 A1 | 10/2002 | Wang | |
| 2003/0010642 A1 | 1/2003 | Taylor et al. | |

OTHER PUBLICATIONS

Informational Literature entitled "*Advanced Copper Metallization for 0.13 to 0.05 μm & beyond,*" by ACM Research Inc. (2000).

H. Dyar et al., "*Electrically Mediated Copper Metallization of Interconnect Features for VLSI Applications,*" Semicon West Conference (Jul. 2003).

H. Dyar et al., "*A Low Cost Semiconductor Metallization/Planarization Process,*" SURFIN 2003 Conference (Jun. 2003).

D-T. Chin et al, "*Current Distribution in Selective Pulse Plating,*" Plating and Surface Finishing, 76, pp. 74-82 (Oct. 1989).

D-T. Chin et al., "*Selective Pulse Plating of Gold and Tin-Lead Solder,*" Plating and Surface Finishing, 78, pp. 57-64 (Feb. 1991).

R. Schuster et al., "*Electrochemical Micromachining,*" Science, 289, pp. 98-101 (Jul. 2000).

* cited by examiner

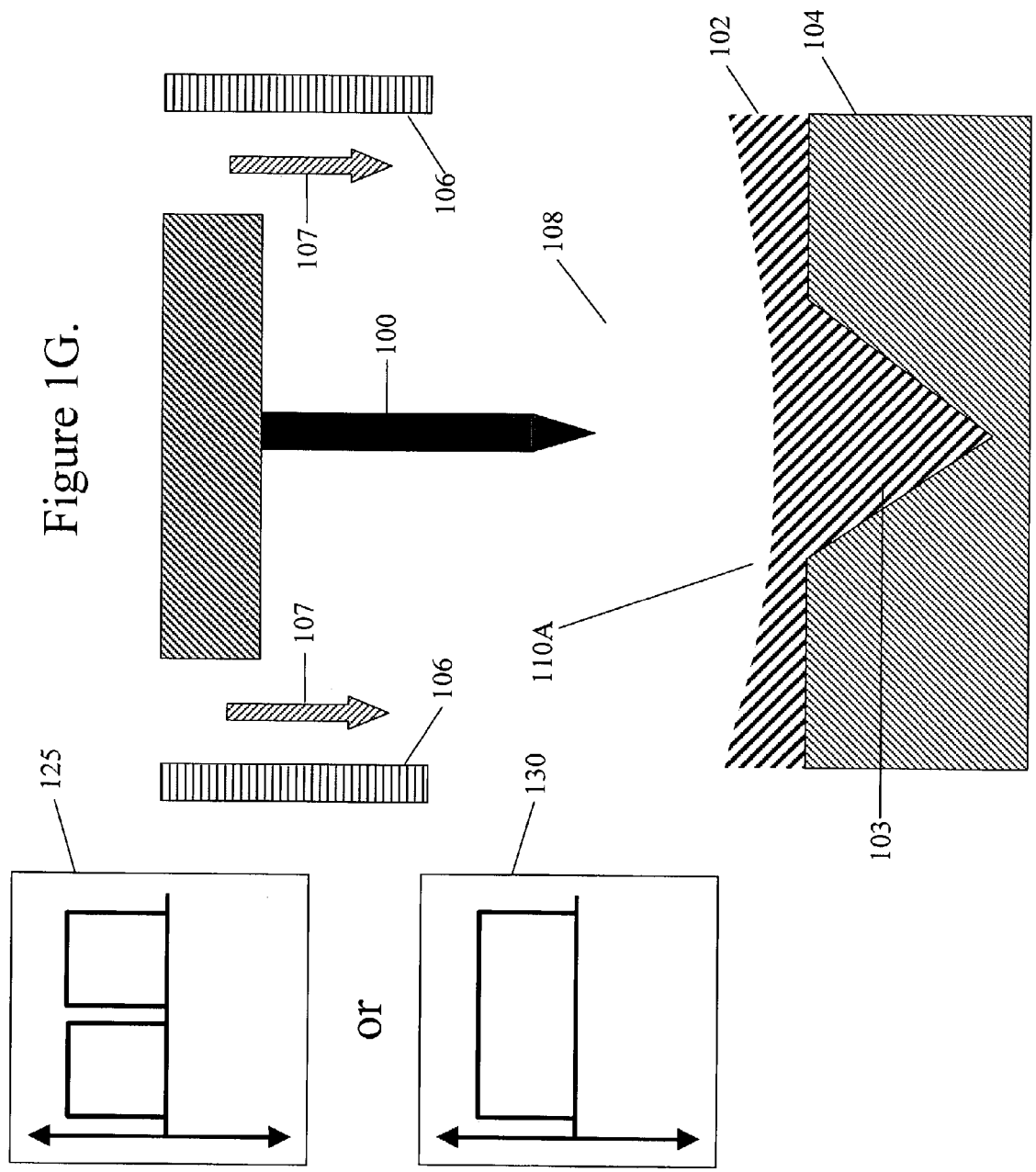

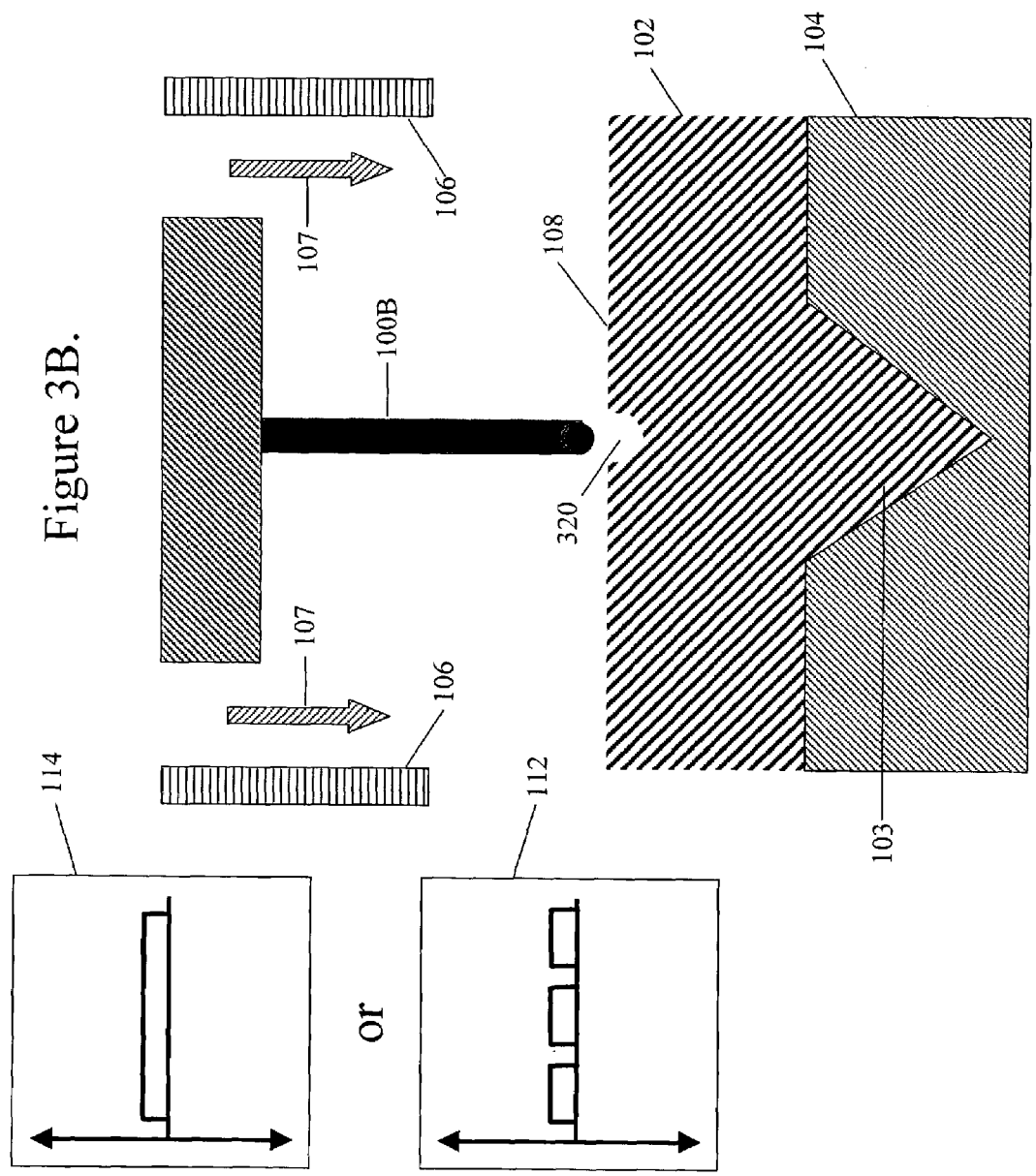

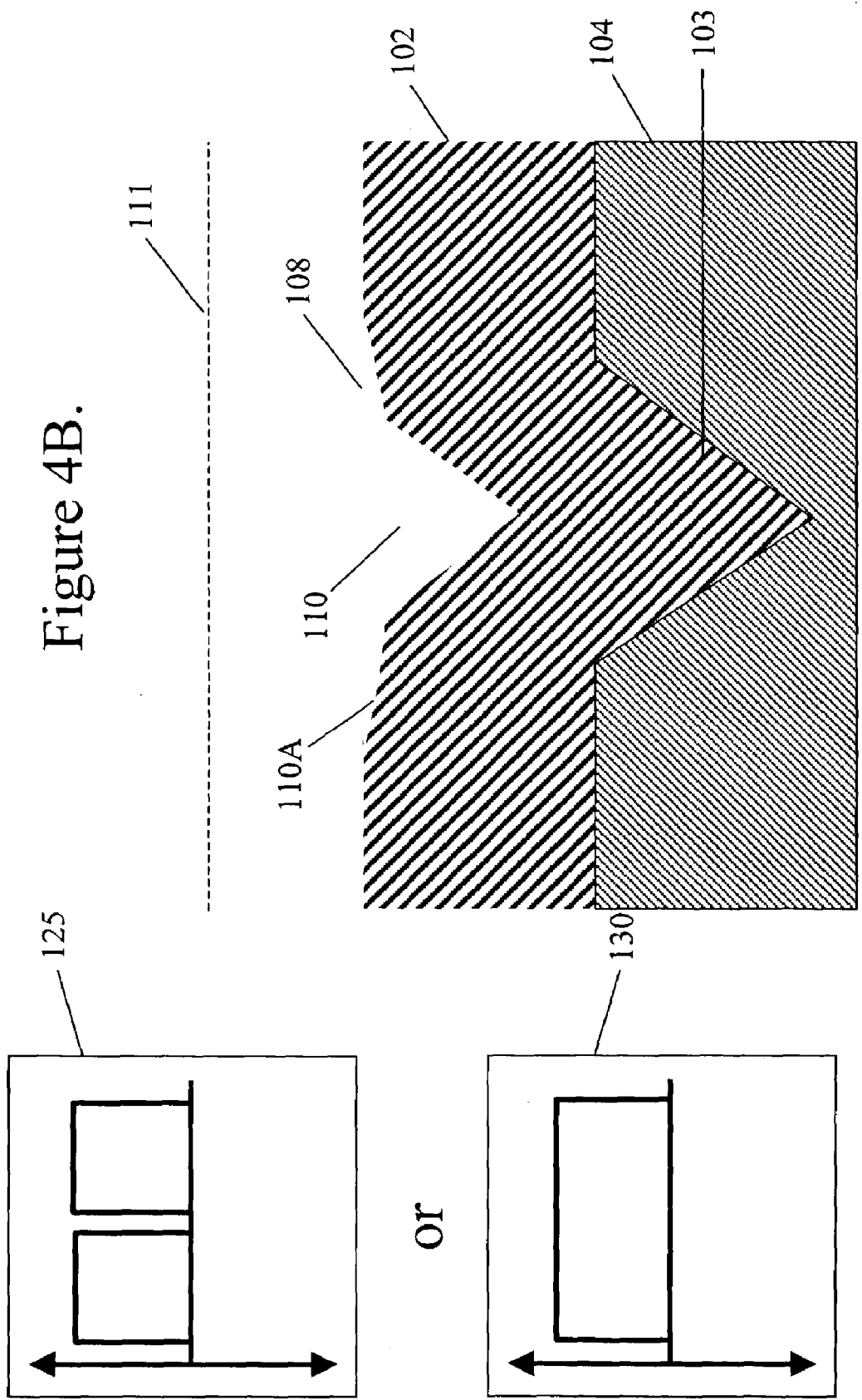

ELECTROLYTIC ETCHING OF METAL LAYERS

PRIORITY CLAIM

This invention claims priority to U.S. Provisional Patent Application Ser. No. 60/387,577 as filed Jun. 12, 2002.

BACKGROUND OF THE INVENTION

1. Field of the Invention

This invention relates to electrolytic etching of metal layers and more particularly to removal of thin metal layers from semiconductor substrates and still more particularly to removal of overplate layers in the production of integrated circuits formed from low-k dielectric interconnects.

2. Brief Description of the Prior Art

The integrated circuits (ICs) that are the fundamental components in modern computers and similar electronic devices are continuously increasing in complexity and performance. Moore's Law, attributed to Intel Corp. cofounder Gordon Moore, predicts that every 18 to 24 months the performance of ICs doubles without a corresponding increase in their cost. This doubling of performance is directly related to the number of transistors that can be packaged into an IC or chip. For example, in 1971 there were ~2000 transistors per chip. More recently, in 1993, the Intel Pentium contained 3.1 million transistors and in 2000 the Pentium 4 had 40 million transistors. The Moore trajectory is expected to be maintained for another 15 years. The trajectory will be maintained by increasing wafer size and reducing the size of the smallest features and interconnects from about 180 nm, which is the current state-of-the-art, down to about 35 nm or less. However, adoption of feature sizes less than about 250 nm has already necessitated the replacement of aluminum conductors with copper, and the transition to feature sizes less than about 100 nm will require replacing the silicon dioxide dielectric material with material having a lower dielectric constant, i.e., less than about 3, that is, so-called low-k materials.

ICs or chips include multiple layers of wiring connecting transistors and other circuit components. A simplified process sequence for fabricating the wiring in a single layer includes: 1) deposition of a dielectric layer using chemical vapor deposition (CVD), 2) patterning and etching metal wiring features in the dielectric layer, 3) metallizing these features using physical vapor deposition (PVD) followed by electroplating, and 4) removing the metal overplate and planarizing the wafer using chemical mechanical polishing (CMP). This simplified process sequence may be repeated up to 40 times, to add hierarchical wiring layers, for a single IC.

Chemical mechanical polishing (CMP) is a process for removing the conductive metal, e.g., copper, overplate in the preparation of a damascene conductor layer on a semiconductor substrate. The surface of the electroplated wafer is abraded using a pad and an abrasive slurry or the like to remove overplated metal and sometimes some of the dielectric layer, thereby isolating the damascene conductors in their trenches. The CMP step also assures a flat surface for applying the next layer of photoresist.

Although CMP is an effective method of planarizing a plated damascene conductor layer when the dielectric layer is made from a hard dielectric material, such as silicon dioxide, problems have arisen when CMP is used with the newer low-k dielectric materials. The low-k dielectrics are somewhat softer than silicon dioxide and possess less mechanical strength. Specifically, under the 3 pounds per square inch (psi) pad pressure typical of the CMP process, the resultant strain of the low-k material is approximately 30 times that of copper. Consequently, the low-k material is easily abraded, distorted, or torn by conventional CMP. This damage may lead to distorted or broken damascene interconnects, delamination between the copper and the dielectric material and/or imperfect planarization.

Accordingly, a need has continued to exist for a method of removing metal overplate from damascene interconnect layers and planarizing the layer that does not suffer from the problems of CMP.

SUMMARY OF THE INVENTION

The problem of damage to low-k dielectric materials produced by CMP is alleviated by the process of the invention wherein metal, e.g., copper overplate, is removed electrolytically. According to the invention a small recess is formed in a layer of overplated metal by electrolytic etching to remove (the depth of removal can vary) the metal at a small localized area. The small area from which the metal layer has been removed is then expanded outwardly by further electrolytic etching until the entire layer has been removed (to the desired depth), leaving the surface below and any damascene interconnects formed therein with a planar upper surface.

One manifestation of the invention is a method for selectively removing a layer of electrolytically dissoluble metal such as copper overplate from a substrate such as a low-k dielectric comprising:

providing a substrate bearing on a major surface thereof a layer of electrolytically dissoluble metal, the metal layer serving as a dissoluble electrode and having a central region and an adjacent peripheral region;

providing at least a first counterelectrode and a second counterelectrode;

positioning the counterelectrodes opposite the metal layer and spaced from the metal layer and spaced from each other;

in a first electrolytic step, passing an electric current between the first counterelectrode and the central region of the metal layer, wherein the first counterelectrode is cathodic with respect to the metal layer, and the first electrolytic step includes a first phase, a second phase, and a third phase, and during the first phase the electric current is a low amperage pulsed or DC current, during the second phase the electric current is a train of anodic pulses having a short on time and a higher amperage than during the first phase, and during the third phase the electric current is a train of higher amperage anodic pulsed or DC current having a longer on time than during the second phase;

and in a second electrolytic step, passing an electric current between the second counterelectrode and the peripheral region of the metal layer, wherein the second counterelectrode is maintained cathodic to the metal layer, and the second electrolytic step includes a first phase, a second phase, and a third phase and during the first phase the electric current or is a low amperage pulsed or DC current, during the second phase the electric current is a train of anodic pulses having a short on time and a higher current than during the first phase, and during the third phase the electric current is a train of anodic pulses having a longer on time than the second phase or DC current.

In this embodiment, during the first phase and second phase of the electrolytic steps, removal of metal is preferably confined to an area approximately the size of the counterelectrode and a depth that is less than or equal to the thickness of the metal layer and during the third phase the area of removal of metal is broadened such that metal is removed throughout the central region of the metal layer.

The first, second and third phases of the first and second electrolytic steps can also be defined in terms of the transition time ($\tau$) and whether the electrolytic process is predominantly controlled by a geometric current distribution or mass transfer effects. During the first phase of the electrolytic step, the current amplitude is selected so that a geometric current distribution is obtained. During the second and third phase, removal is predominantly controlled by mass transfer. In the second phase conditions such as agitation of the bath, substrate rotation and pulse on time are further controlled such that the boundary layer has a macroprofile. In the third phase, the conditions are controlled such that the boundary layer has a microprofile.

In one embodiment, the electrolyte is selectively interposed between the central region of the metal layer and the first counterelectrode during the first electrolytic step and the electrolyte is interposed between the second counterelectrode and the pheripheral region of the metal layer during the second electrolytic step.

In another embodiment the method additionally comprises providing at least one or more additional counterelectrode(s) and conducting one or more additional electrolytic step(s) comprising passing an electric current between the additional counterelectrode and the metal layer.

BRIEF DESCRIPTION OF THE DRAWINGS

FIGS. 1A–1H are schematic illustrations of the first electrolytic step of a method in accordance with one embodiment of the invention for removing an overplate from the central region of a substrate.

DETAILED DESCRIPTION OF THE INVENTION

The present invention provides a method for planarization of Cu/low-k interconnects for the fabrication of integrated circuits and, more particularly, nanochips. The method of the invention can be carried out using any suitable electrolytic etching apparatus. In one embodiment the apparatus described in U.S. Pat. No. 6,440,295 and U.S. Published Patent Application 2002/0153246 A1 to Wang is used. That apparatus includes a vessel that is divided into concentric sections by a combination of annular section walls. In the apparatus illustrated in that published application, there are three sections, namely, a center section and two annular concentric sections. Each section houses a counterelectrode, which can be formed from any suitable electrode material such as titanium, platinum or copper. In practice, the number of sections and electrodes will be selected to facilitate achieving a uniform etch and may require about 7 to 30. The wafer or other substrate to be treated is clamped in the vessel using a chuck in a position in which it is located opposite the counterelectrodes and the sections housing them. More preferably the wafer or other substrate to be treated is positioned slightly away from the counterelectrodes and bridges the sections housing the electrodes and the surface to be treated faces into the vessel with a small space between the treated surface of the wafer and the section walls. Preferably, a drive mechanism is provided to rotate and oscillate the wafer during the etching process. The electrode in the center section can be a rod whereas the electrodes in the concentric sections can be annular. The published application discloses that other electrode configurations can be used. Additionally, each section includes an inlet for a supply of electrolyte, which is pumped into and out of each section as described in more detail in the published application using any convenient pump. Liquid mass flow controllers deliver the electrolyte at flow rates, which are adjusted for the volume of the section. The application teaches flow rates between about 0.5 and 40 liters per minute.

One of the problems encountered in etching or deplating the overplated layer is removing the overplated layer without leaving behind small islands of overplated layer on the substrate. In accordance with this invention, deplating is accomplished without island formation by systematically removing the overplated layer from the inside/center of the wafer first and deplating radially outwardly as island-free removal is achieved at the radially inward areas.

Figure 1A:
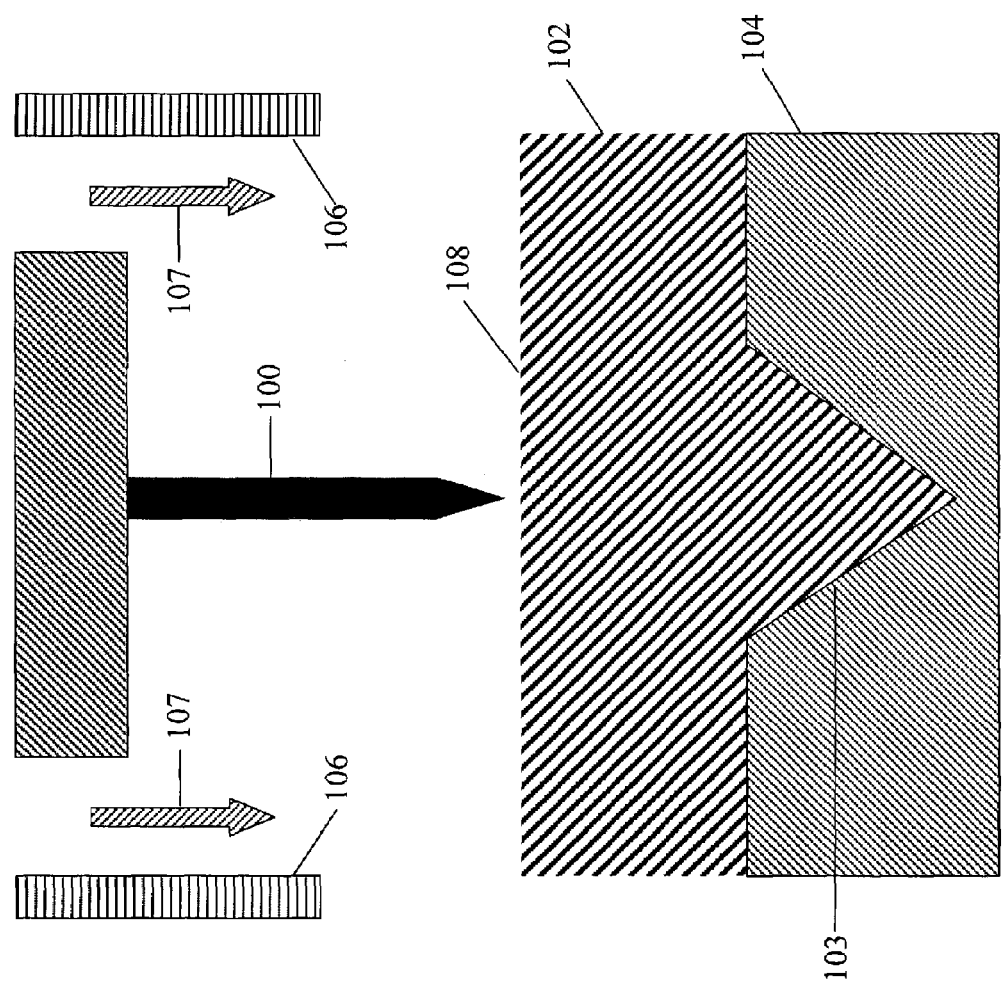

FIG. 1A illustrates a rod electrode 100 shown over a substrate 104 that can be a dielectric low-k layer that is covered with a copper or other electrolytically active overplated layer 102. While the figure depicts an orientation with the electrode 100 above the copper overplate 102 and substrate 104, the orientation could be rotated 90°, 180°, 270°, 360°, or any angle in between. A barrier layer may be interposed between the overplate 102 and the substrate 104 but is not shown in this particular embodiment. Optionally an annular wall 106 can be formed around the electrode 100. This wall permits one to restrict the electrolyte flow 107 to the center region 108 of the overplate 102 positioned above the center region of the substrate 104 in accordance with select embodiments of the invention. According to the method of the invention an electrolyte 107 is interposed between and in contact with the electrically conductive overplate and the counterelectrode. Using the apparatus described above, the electrolyte 107 optionally can be supplied selectively to that area of the metal layer that is to be removed and subsequently each of the adjacent areas of the metal layer as they are removed. In another embodiment, the electrolyte 107 is not supplied to selective areas but rather the substrate is immersed in a bath that is agitated and circulated in a conventional manner.

The diameter and shape of the electrode affects the initial etching pattern. Therefore, the rod electrode may end in a point as shown in FIG. 1, a disc, a radius (e.g., hemisphere), or other desired shape. Examples of other electrode shapes are provided in FIG. 3. The electrode diameter is typically not greater than 10 mm, preferably not greater than 1 mm, and in many cases not greater than 100 µm or 10 µm. The distance between the electrode and the surface of layer 102 is typically less than 10 mm, but may be less than 1 mm, or less than 100 µ, or less than about 10 µ.

An electric current is passed between the counterelectrode 100 and the copper overplate 102 by a conventional power supply (not shown) with the overplate 102 being maintained anodic with respect to the counterelectrode. The electric current may be controlled by either controlling the current of the power supply or by controlling the voltage of the power supply. In either case, current is caused to flow between the counterelectrode 100 and the overplate 102. Electrodissolution of the metal surface will produce an excess concentration of metal ions at the surface, which are removed by an electrolyte 107 bath that circulates through the device as described earlier. A thin layer (not shown) immediately adjacent to the substrate surface known as a "boundary layer" does not partake in the general agitation of the bath. Consequently, the metal ions must travel through this layer by diffusion before they reach the bulk bath. This layer is a function of a mathematical construct known as the Nernst diffusion layer and another mathematical construct referred to as the electrodynamic layer. The thickness of the Nernst diffusion layer is a function of kinematic viscosity, agitation of the bath, flow of the electrolyte, rotation of the substrate, and other factors. The electrodynamic layer is a function of electrodynamic functions such as pulse on time. A similar problem of transfer of metal ions through the boundary layer occurs in electrodeposition of metals on a substrate. The effects produced by the presence of the boundary layer are generally discussed in the electroplating context, but similar considerations apply when material is removed from a surface by electrodissolution.

Figure 1B:
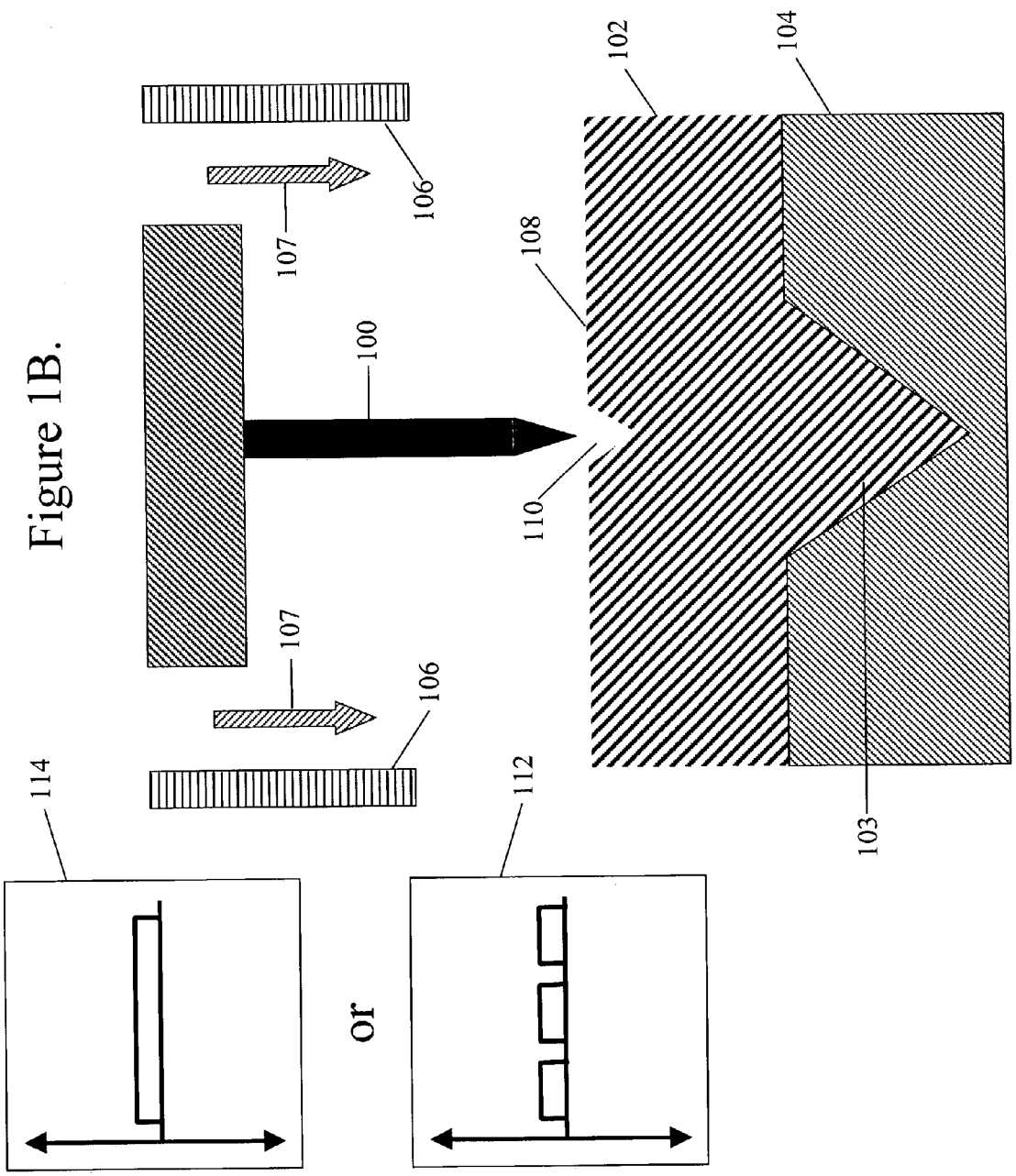

In accordance with one embodiment of the invention, the electrolytic steps are performed in three phases. In the first phase, electrolytic etching is confined to the vicinity of the electrode itself. The electric current is controlled to yield predominantly a geometric current distribution. A pulsed electrolysis wave sequence 112 is used in accordance with one embodiment of the invention or a low amperage DC current 114 is used in another embodiment to concentrate the removal of the overplate 102 to the vicinity of the counterelectrode during the early stages of counterelectrode activation as illustrated in FIG. 1B. By "low amperage" is typically meant about 1 to 5 milliamps per square centimeter. The effect of pulsed current, also described as modulated current or modulated charge transfer, is described in detail in U.S. Pat. No. 5,599,437, to Taylor et al., the entire disclosure of which is incorporated herein by reference. The detailed disclosure in U.S. Pat. No. 5,599,437 is given in terms of an electroplating process, wherein metal is deposited from the electrolyte solution onto the surface of a substrate. However, the same principles apply to an electrodissolution process, wherein an electrolytically dissolvable material, e.g., a metal, is removed from the surface of a substrate. In general, if the charge is transferred in short pulses, i.e., if the current is applied in short pulses, the boundary layer will be thinner than it is under DC electrolysis conditions, because the full thickness of the layer does not have time to develop before the pulse terminates.

During the first phase of the first electrolytic step in the process of the invention, as shown in FIG. 1B, a small recess 110 is etched in the overplated layer 102 on the surface of the substrate 104 using a wave sequence made up of a series of low amperage short pulses 112 or low amperage DC current 114 (FIG. 1B). While the shape of the small recess will generally mirror the end shape of the counterelectrode, the size of the small recess may be slightly larger or of a similar size relative to the dimensions of the counterelectrode. In fact, modeling and experimental studies by D-T. Chin, N. R. K. Vilambi, and M. K. Sunkara in Plating & Surface Finishing, 76 p. 74 October 1989 and D-T. Chin and M. K. Sunkara in Plating & Surface Finishing, 78 p. 57 February 1991 have indicated that the current distribution during the pulse electrolysis may result in smaller dimension of the recess relative to the dimensions of the counterelectrode. More recently it has been reported by R. Schuster et al. in Science, 289 p. 98 Jul. 7, 2000 that 200 nanosecond pulses can drill a 40 μm hole using a 50 μm counterelectrode.

For the low current or voltage pulsed waveform 112 or DC waveform 114 used in the first phase, current distribution is determined principally by the electrode geometry (i.e., primary or geometric current distribution controlled by ohmic effects) and effects due to secondary current distribution controlled by kinetic effects and tertiary current distribution controlled by mass transport effects are minimal. Due to the low current or voltage used in FIG. 1B to start the recess, the transition time (τ) is long enough that removal of the metal is not predominantly controlled by mass transfer. Specifically, the transition time is inversely related to the square of the current density by the equation $$\tau = ((nF)^2 C_b^2 D)/2i_c^2$$

where: τ is the transition time; n is the number of electrons transferred in the electrode reaction; F is the Faraday constant; $C_b$ is the concentration of electroactive species; D is the diffusion constant of the reacting species, i.e. the dissolving overplate metal; and $I_c$ is the current density.

From the equation it follows that when the pulse on time is significantly longer than the transition time, an electrodynamic layer is established during each pulse, and mass transport effects have a significant influence on the current distribution. Conversely, when the pulse on time is significantly less than the transition time, mass transport effects have less influence on the current distribution. However, when the current is very low, as in FIG. 1B, the transition time is long enough that mass transport effects are minimal even with DC current.

With time, the recess 110 becomes increasingly larger and in order to maintain the continuation of the general shape of the recess ("conformal removal") a second phase is implemented where a waveform 120 is used. To form and enlarge the recess 110 in the overplated layer 102, the pulse width illustrated in FIGS. 1B and 1C may range from about 0.1 microsecond to about 100 milliseconds, although shorter or longer pulses are not excluded, provided that they yield a substantially greater rate of removal of the overplated layer in proximity to the center electrode than elsewhere on the substrate surface. It is preferred that the short pulses used in first and second phases are no longer than about 10 milliseconds, more preferably no longer than about 1 millisecond, and most preferably no longer than about 100 microseconds for this part of the process. The off-times and/or reverse times (discussed later) between the pulses may range from about 10 microseconds to about 500 milliseconds. The duty cycle of the pulse train in the first and second phases, i.e., the ratio of on time to off time, may range from about 0.001 to about 0.5. Expressed in percentage, the duty cycle is preferably no greater than about 50%. More preferably it is no greater than about 25% and still more preferably not greater than about 10%.

Figure 1C:
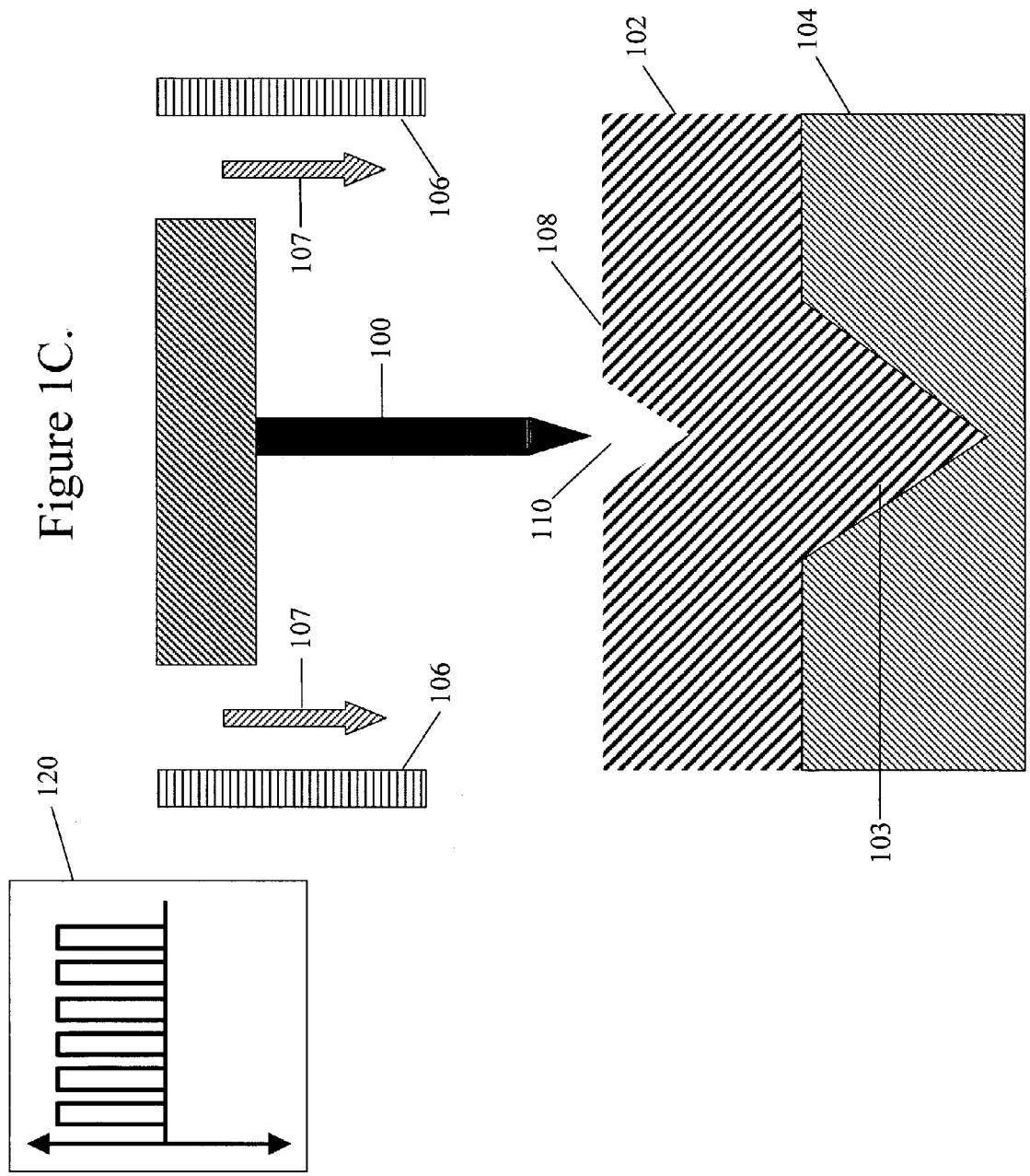
Figure 4A:
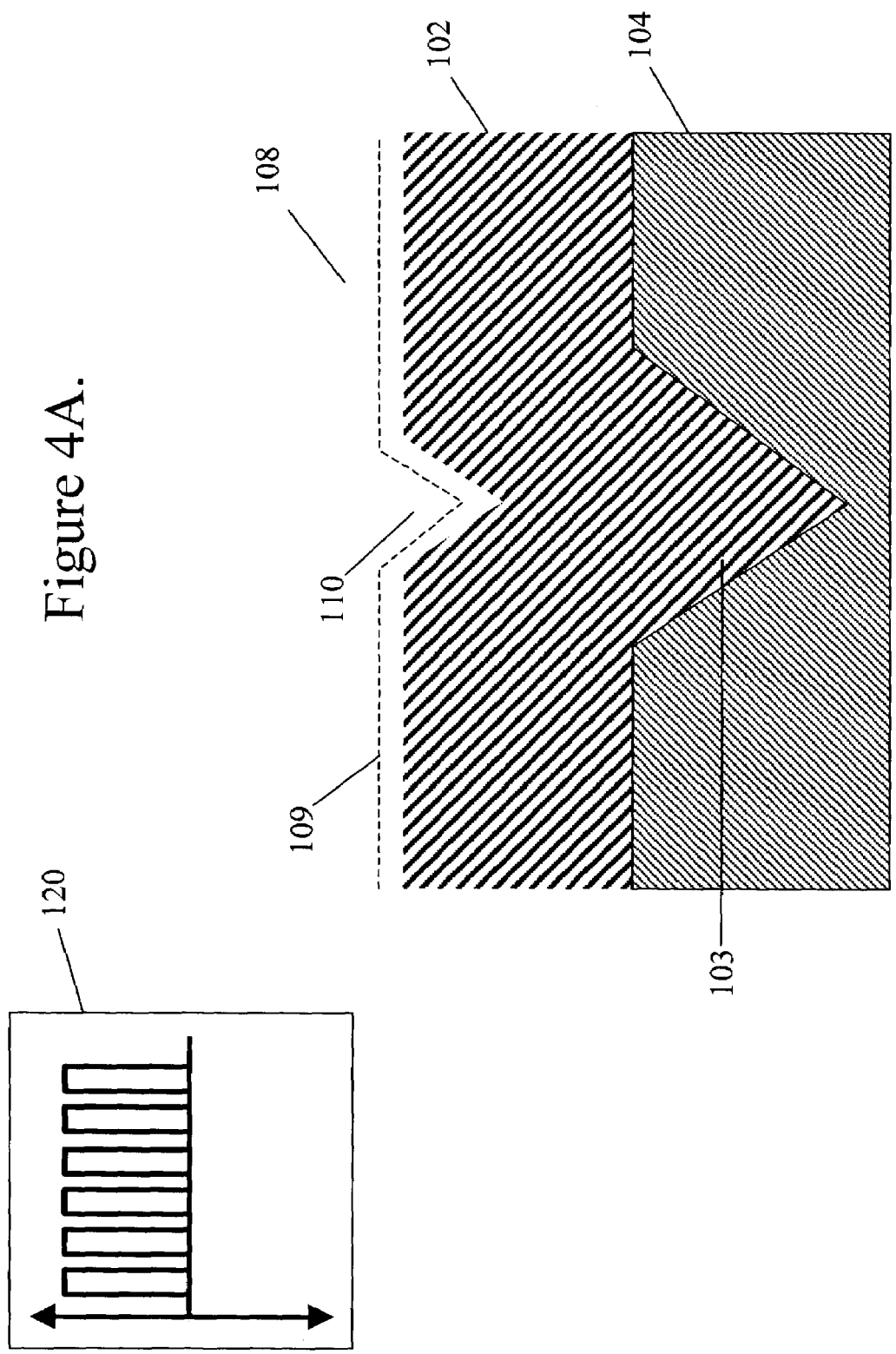
FIG. 4 is a schematic illustration of a boundary layer having a macroprofile (4A) and a microprofile (4B).

As shown in FIG. 1C, waveform 120 has short pulse on times such that the electrodynamic diffusion layer is conformal to the recess 110. This is known as a "macroprofile." Additionally, the peak current is large enough e.g., greater than 5 milliamps/cm² to 200 milliamps/cm² such that the transition time (τ) is short enough such that tertiary current distribution or mass transport effects are significant. The effect of the pulse current amplitude may be understood in terms of its influence on the role mass transport plays in the process. The use of the concepts primary or geometric current distribution, secondary or kinetic current distribution, tertiary or mass transport current distribution, macroprofile and microprofile are more fully described in U.S. Pat. No. 6,524,461 to Taylor et al., the entire disclosure of which is incorporated herein by reference. FIG. 4A illustrates a boundary layer that has a macroprofile. The layer is characterized in that it conforms to the recess 110 in the layer 102.

As shown in FIGS. 1D–1H, after recess 110 moves deeper into the overplate layer 102 to a predetermined distance above or level with interconnect feature 103, it is desired to continue to remove metal overplate from the shoulder 110A of recess 110. Subsequently, the third phase is initiated by using a wave sequence 125 made up of long pulses or DC waveform 130 such that the boundary layer represents a microprofile relative to recess 110. Additionally, the current of voltage of pulsed waveform 125 or DC waveform 130 is large enough such that the transition time (τ) is short and tertiary or mass transport current distribution effects are significant. FIG. 4B illustrates a boundary layer having a microprofile. The layer does not conform to the recess which renders the deeper portions of the recess less hydrodynamically accessible.

Figure 1D:
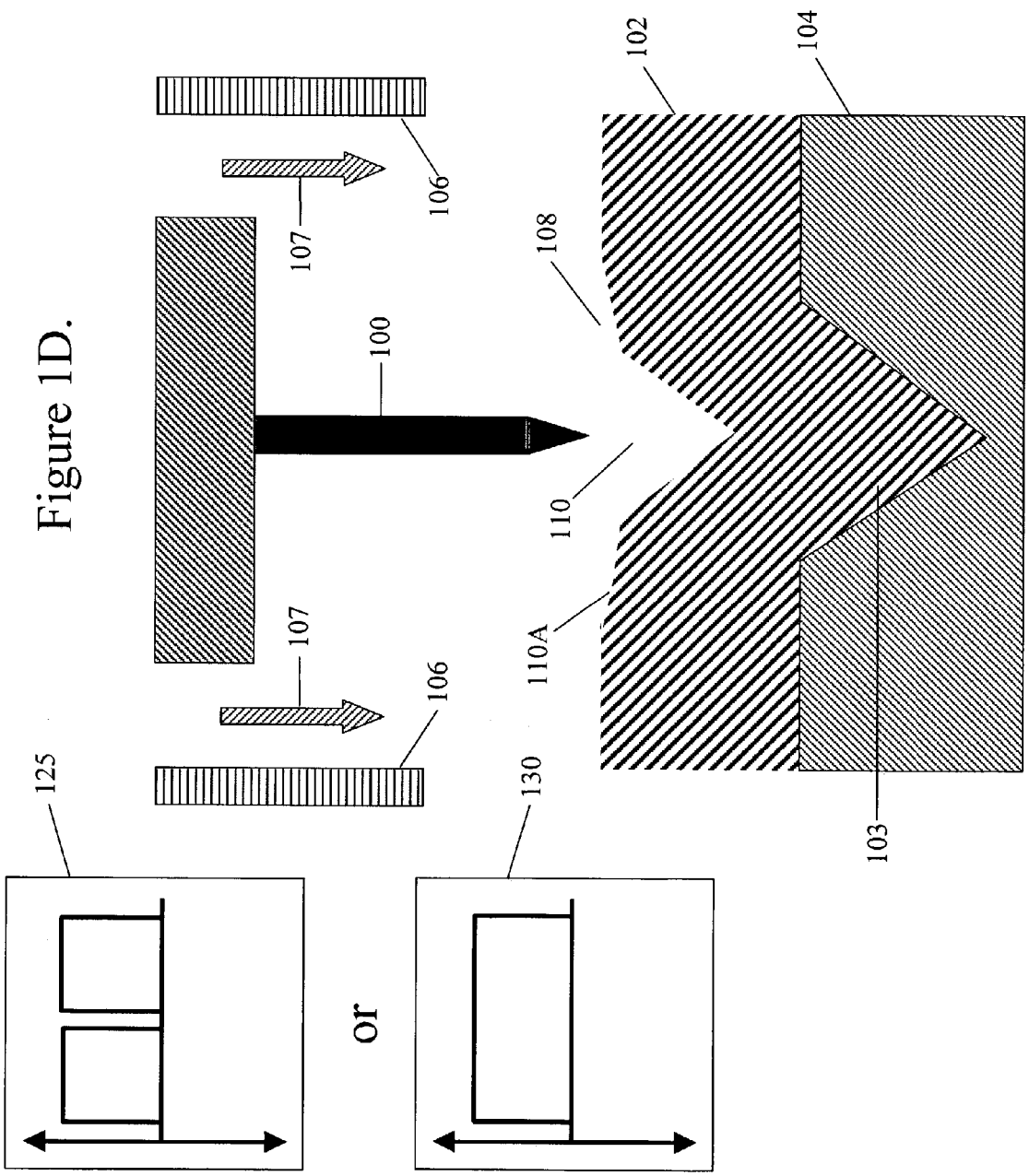
Figure 1E:
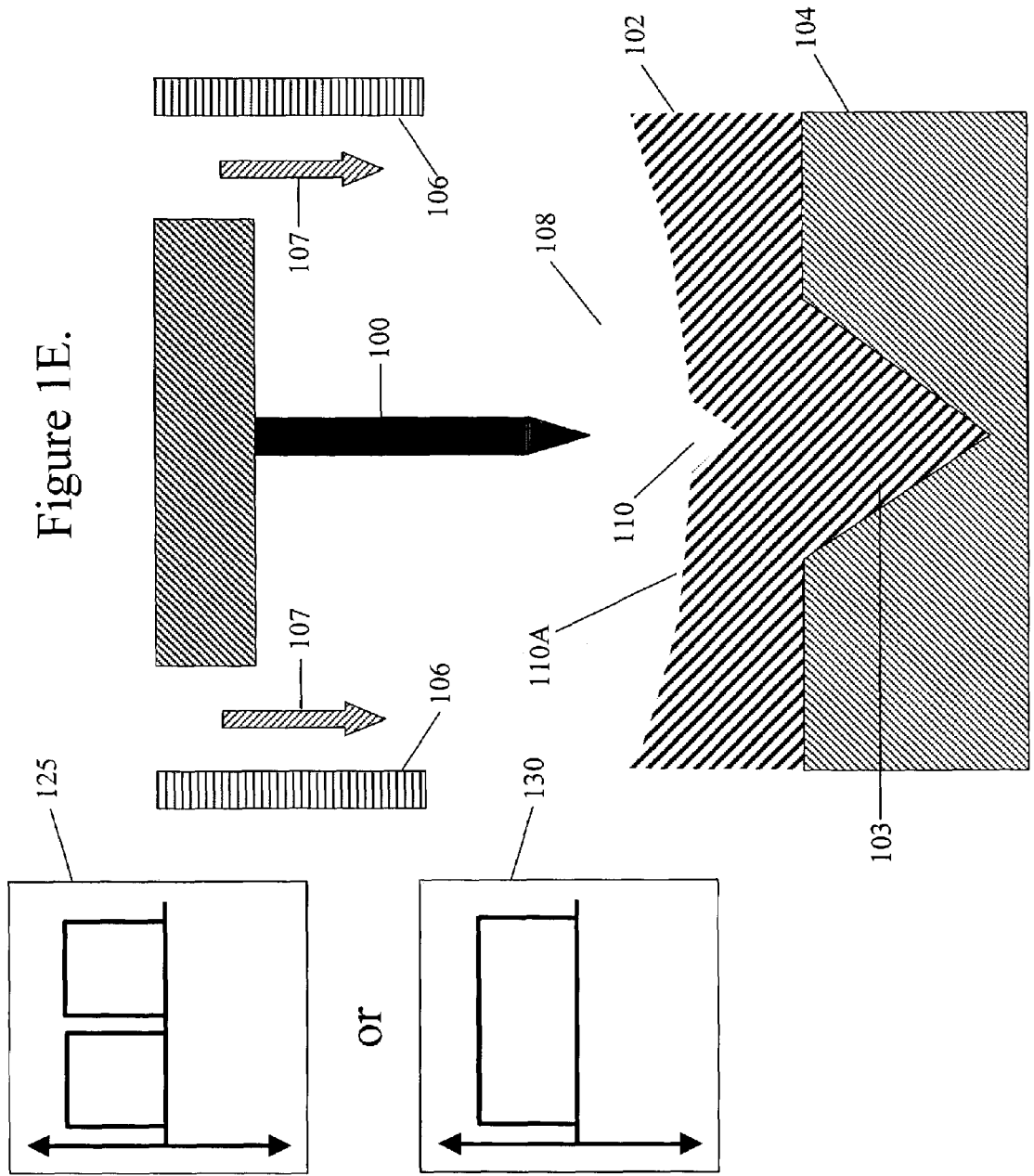
Figure 1F:
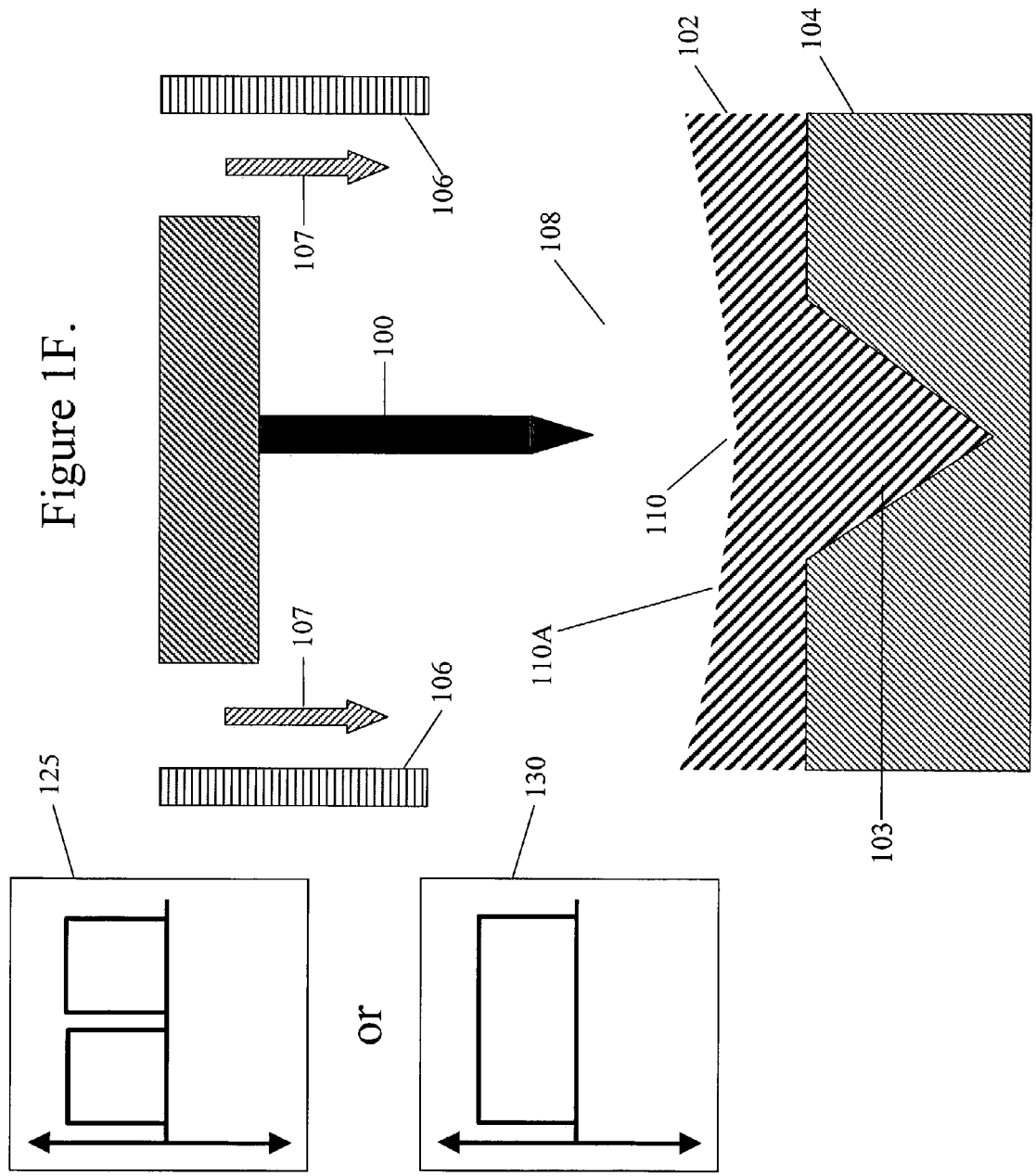
Figure 1H:
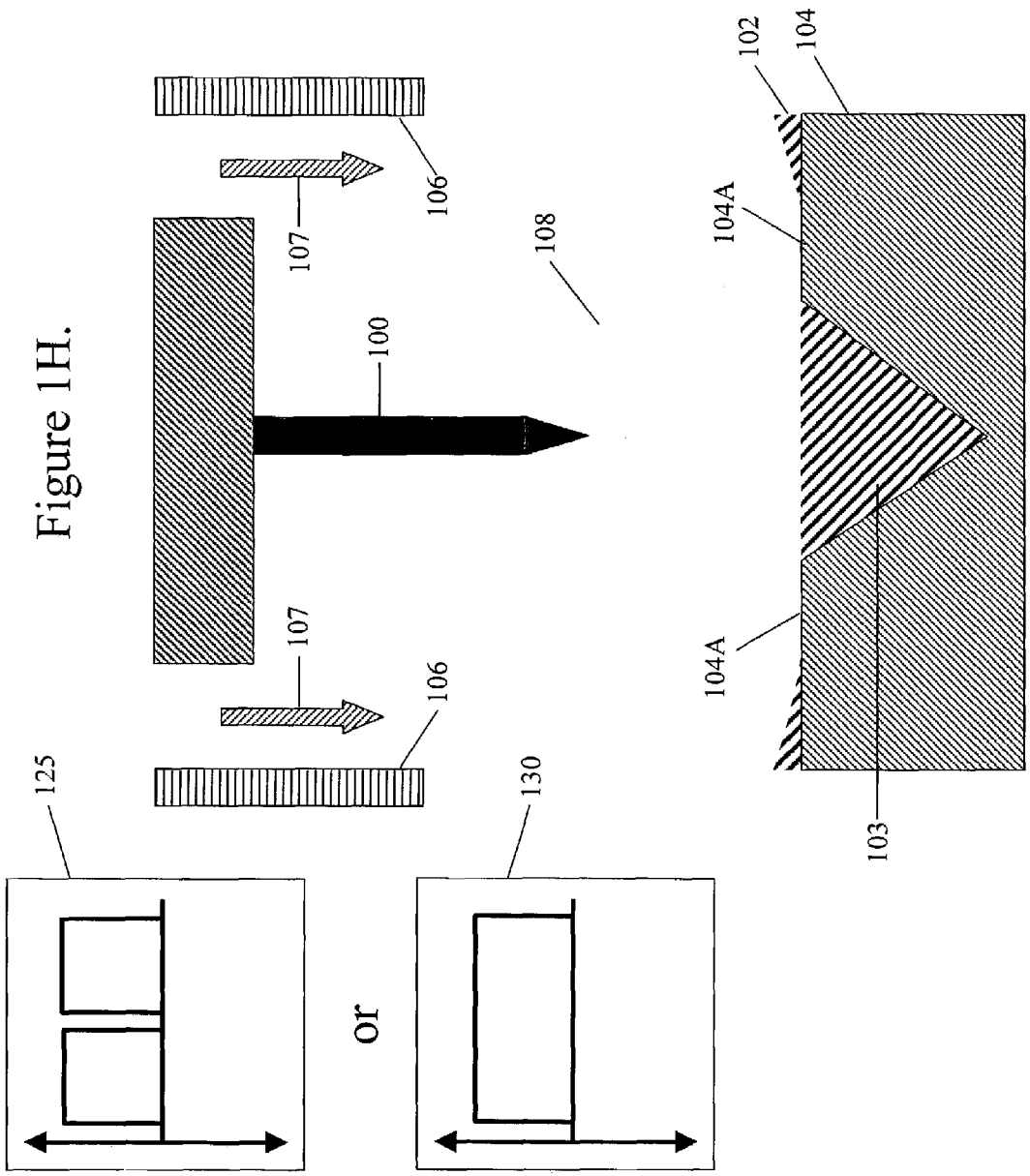

Finally, as shown in FIG. 1H, the electrical contact between the metal overplate 102 and the interconnect 103 is discontinued by the non conductive substrate 104A. Consequently, the undesired metal overplate 102 is removed while the interconnect 103 is left substantially undamaged.

During the first phase of the process, the current only drives the center electrode 100 while the annular electrode 200 (FIG. 2) remains dormant in this particular embodiment. In one embodiment, electrolyte 107 is selectively supplied and circulated to only the region of the substrate that is bounded by the section wall 106 of the electrolytic apparatus surrounding the first (rod) counterelectrode 100 as taught in U.S. Published Application 2002/0153246A1 and U.S. Pat. No. 6,440,295. In other embodiments, as mentioned above, the supply of electrolyte 107 is not restricted to the area of the active electrode. In the latter case, removal of the metal ions can be accomplished by assuring a rapid transverse flow of electrolyte across the substrate surface. For this purpose the substrate may be rotated rates of about 10 to 100 rpm, or their approximate equivalent in terms of solution flow in terms of the Nernst diffusion layer should be suitable.

In the waveform used in the second phase of the first electrolytic step of the process of one embodiment the invention illustrated in FIG. 1C, the current is short anodic pulses having an on time less then the transition time or low DC current. Because the anodic pulses are those active in removal of metal, they are denoted forward pulses for purposes of this application. In some cases it may be desirable to use a reverse current during the process, i.e., a current which deposits metal as opposed to removes it. This may be helpful in avoiding islands. Islands form when there is a loss of electrical contact between the deplating region and the balance of the overplated layer. If the operator detects that electrical contact is about to be lost, the operator can reverse the current to plate metal to enhance contact between the deplating region and the balance of the overplated layer. With contact enhanced the operator can pursue a different deplating geometry so as to remove the overplated layer without causing a loss of contact that would result in forming an island. The use of reversing currents in electropolishing is described in U.S. Pat. Nos. 6,402,931 and 6,558,231 to Taylor et.al., the entire disclosure of which is incorporated herein by reference.

In the first phase of the electrolytic step using the first electrode 100, the recess 110 is preferably etched to a depth, which does not damage the features in the low-k layer in FIGS. 1B–1C. In accordance with one embodiment of the invention, the recess 110 can be started and etched to a non-interfering depth with the center electrode 100 positioned relatively closely to the surface of the overplated layer, for example 0.05 mm to 10 mm. With the center electrode 100 spaced close to the overplated layer, the etching pattern occurs at a relatively acute angle as shown schematically in FIGS. 1B and 1C and produces a recess 110 in the overplated layer with a shape approximating the endshape of the counterelectrode. As discussed earlier, the dimensions of this recess may be larger than, approximately equal to, or smaller than the dimensions of the counterelectrode.

Once a depth is reached at which one can no longer be confident that further etching will not invade and damage the underlying features, the second phase process conditions are adjusted so that the recess 110 is preferentially widened instead of deepened, although as the recess is widened it will also deepen as shown in FIGS. 1D–1H. The recess 110 can be enlarged using a wave sequence 125 of higher amperage long pulses as illustrated in FIGS. 1D–1H. The amperages used are typically greater than 5 milliamps. In one embodiment, this is accomplished using higher current pulses 125 or higher DC current 130 so that metal removal is controlled by mass transfer, i.e., a shorter transition time.

In another embodiment disclosed in U.S. Ser. No. 10/459,728 filed on Jun. 11, 2003, the electrode additionally can be withdrawn to a position at which the electric field at the overplated layer is less concentrated and etching occurs at a more oblique angle as shown in FIG. 1D–1H converting the recess 110 in FIG. 1C to a concavity 110A in FIG. 1D–1H. Accordingly, one embodiment of the invention includes optionally moving the electrode from a position in close proximity to the wafer surface at the beginning of the etching cycle (e.g., FIGS. 1B and 1C) and moving it further from the wafer (e.g., about 1 to 100 mm) as etching progresses (e.g., FIGS. 1D and 1E).

In progressing from an acute recess in FIG. 1B or 1C to a concavity as shown in FIG. 1D, it has been found desirable to use a waveform in which the pulses increase in pulse width for the third phase of the electrolytic step. This waveform favors the removal of metal by mass transfer. As a result metal is removed from the shoulder of the recess 110 (FIG. 1D) preferentially under these conditions to form the broader concavity 110A of FIGS. 1E–1G. For this step of the process of the invention, the length of the pulses in the pulsed current can be lengthened and the off time between the pulses reduced. In fact, if there is no practical need for a reversing pulse, at this stage the process may be a higher DC waveform 130(e.g. greater than about 5 milliamps). The anodic or forward pulses in this stage (FIGS. 1D–1H) of the process should be longer than those in the first stages (FIGS. 1B–C) and in general will have a pulse duration or pulse width of at least 100 milliseconds, preferably at least 500 milliseconds. The off-times will also in general be shorter than in the first step of the process. The duty cycle is preferably greater than about 50%. More preferably it is greater than about 75% or even 90%. In addition, in conjunction with the change in the length of the pulses, the degree of agitation of the bath and the rotation of the wafer may be reduced so that the Nernst diffusion layer is much greater than the dimension of the recess, a condition illustrated in FIG. 4B and referred to as a microprofile as discussed in U.S. Pat. No. 5,599,437 to Taylor et al., the entire disclosure of which is incorporated herein by reference.

As discussed above, in the third phase the current or voltage amplitude is adjusted so that the transition time is small relative to the pulse on time. In this manner, the bottom of the recess is made to be effectively hydrodynamically inaccessible and the metal overplate is removed to form a broader concavity. Metal is removed from the rim and the shoulders 110A of the recess 110 as opposed to deepening the recess. Accordingly, in accordance with one embodiment of the invention, the recess 110 formed in the overplate is expanded by adjusting the waveform with respect to the transition time ($\tau$) so that the deeper portions of the recess become less hydrodynamically accessible. In another embodiment, in addition to adjusting the waveform, the electrode can be spaced further from the overplate layer.

Figure 2A:
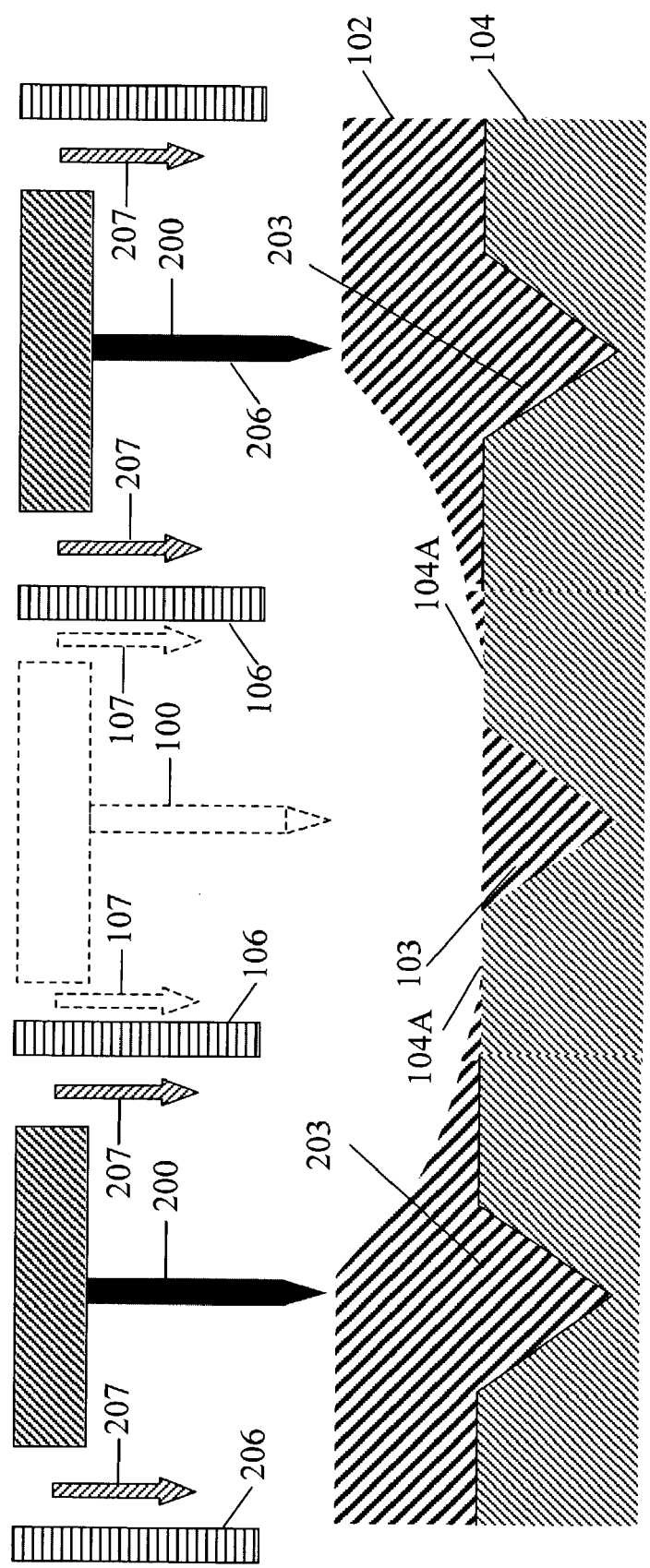
FIGS. 2A–2D are schematic illustrations of the second electrolytic step of a method in accordance with one embodiment of the invention for removing the overplate in a peripheral region of a substrate.
Figure 2B:
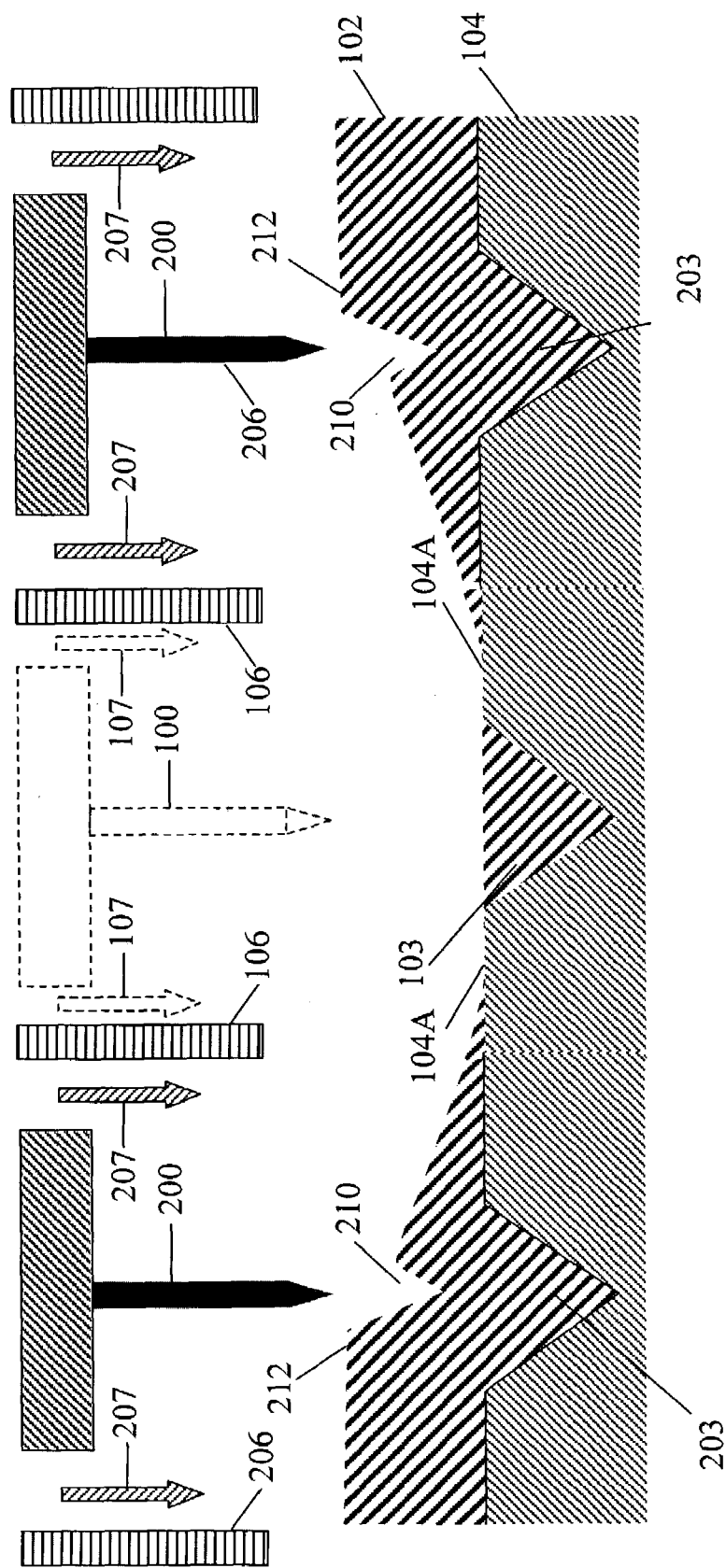
Figure 2C:
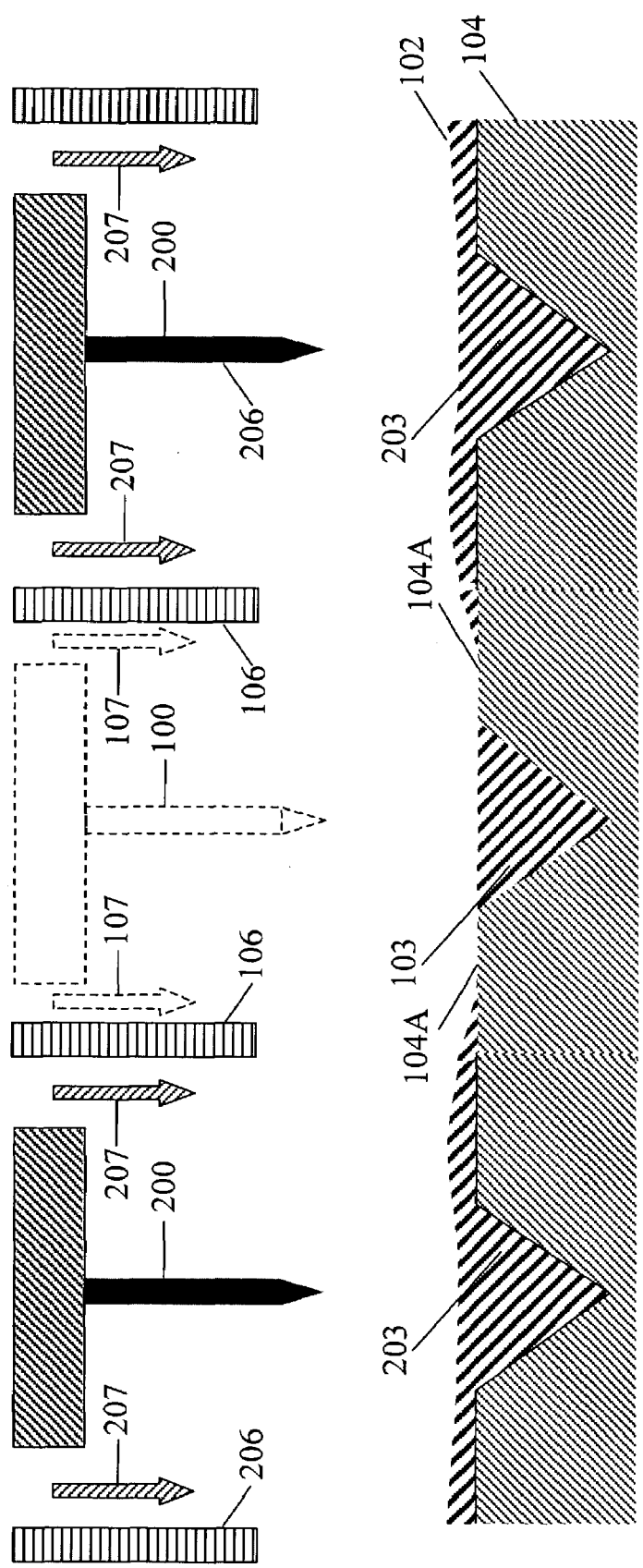
Figure 2D:
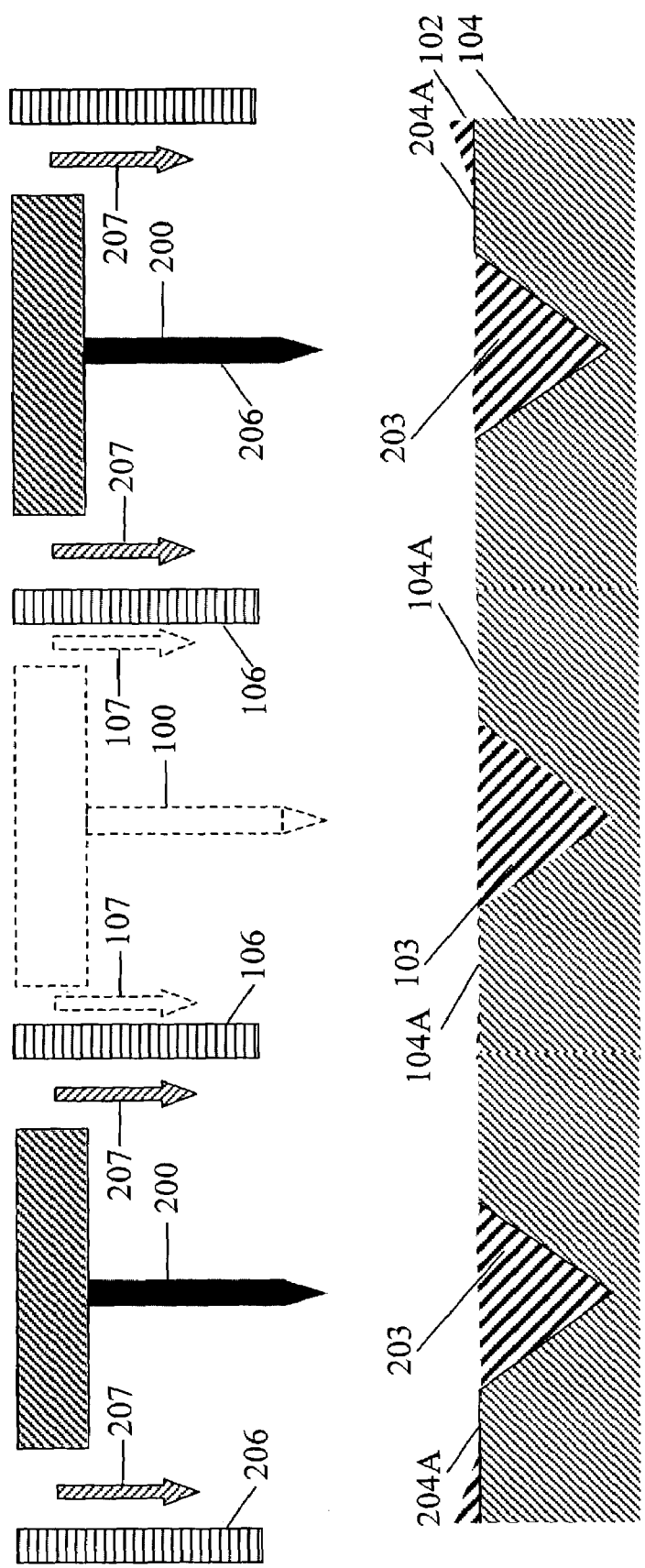

After the overplated layer has been removed from the center of the wafer, as illustrated in FIG. 2A, the center counterelectrode 100 can be turned off, the supply of electrolyte 107 to the center counterelectrode optionally can be stopped (if the electrolyte is being selectively supplied), and the innermost annular counterelectrode 200 and its electrolyte supply 207(optionally) can be activated. The electrode 200 is controlled similar to the way that electrode 100 is controlled during the first electrolytic step. An exemplary waveform used in the first phase of the second electrolytic step is preferably made up of pulses or low amperage current DC waveforms as discussed for FIG. 1B in order to achieve geometric current distribution and metal removal in the vicinity of the electrode without advancing removal by mass transfer until a recess 210 is formed. In the second electrolytic step of the process, like the first electrolytic step, it may be desirable to limit the depth of the etch achieved under these conditions so that the acute removal angle does not inadvertently result in damage to the features in the underlying layer. Furthermore, in this step of the process, like the first, the innermost annular counterelectrode 200 may be positioned close to the substrate surface, e.g., at a distance of about 0.05 mm to 10 mm. To enlarge the recess 210, the electric current includes a train of anodic pulses having a short on time and a higher current as discussed for FIG. 1C. This is shown in FIG. 2B. When the desired removal has been achieved, the etching conditions are adjusted as shown to provide longer (possibly D.C.) pulses and to achieve a removal of the overplated layer preferentially from the rim 212 or shoulder of the deplated region 210. As shown in FIGS. 2C and 2D at this phase, as described above, the current can be adjusted to favor removal by mass transfer as discussed above with regard to FIG. 1D. Finally, as shown in FIG. 2D, the electrical contact between the metal overplate 102 and the interconnect 203 is discontinued by the non conductive substrate 204A. Consequently, the undesired metal overplate 102 is removed while the interconnect 203 is left substantially undamaged. Similarly, as described in the aforementioned contemporaneously filed application, the electrode optionally can also be moved farther from the wafer to provide a more oblique removal pattern that is less likely to result in inadvertent damage to underlying features. Continued etching using the longer higher voltage pulses discussed above for FIGS. 1D–1H completes the removal of the overplate layer 102. As in the case of the operation of the center electrode 100, if at any point in the process it appears that there is a danger of forming islands, the current can be reversed to cause the metal to plate and an alternate removal pattern can be adopted to avoid formation of any islands.

Figure 3A:
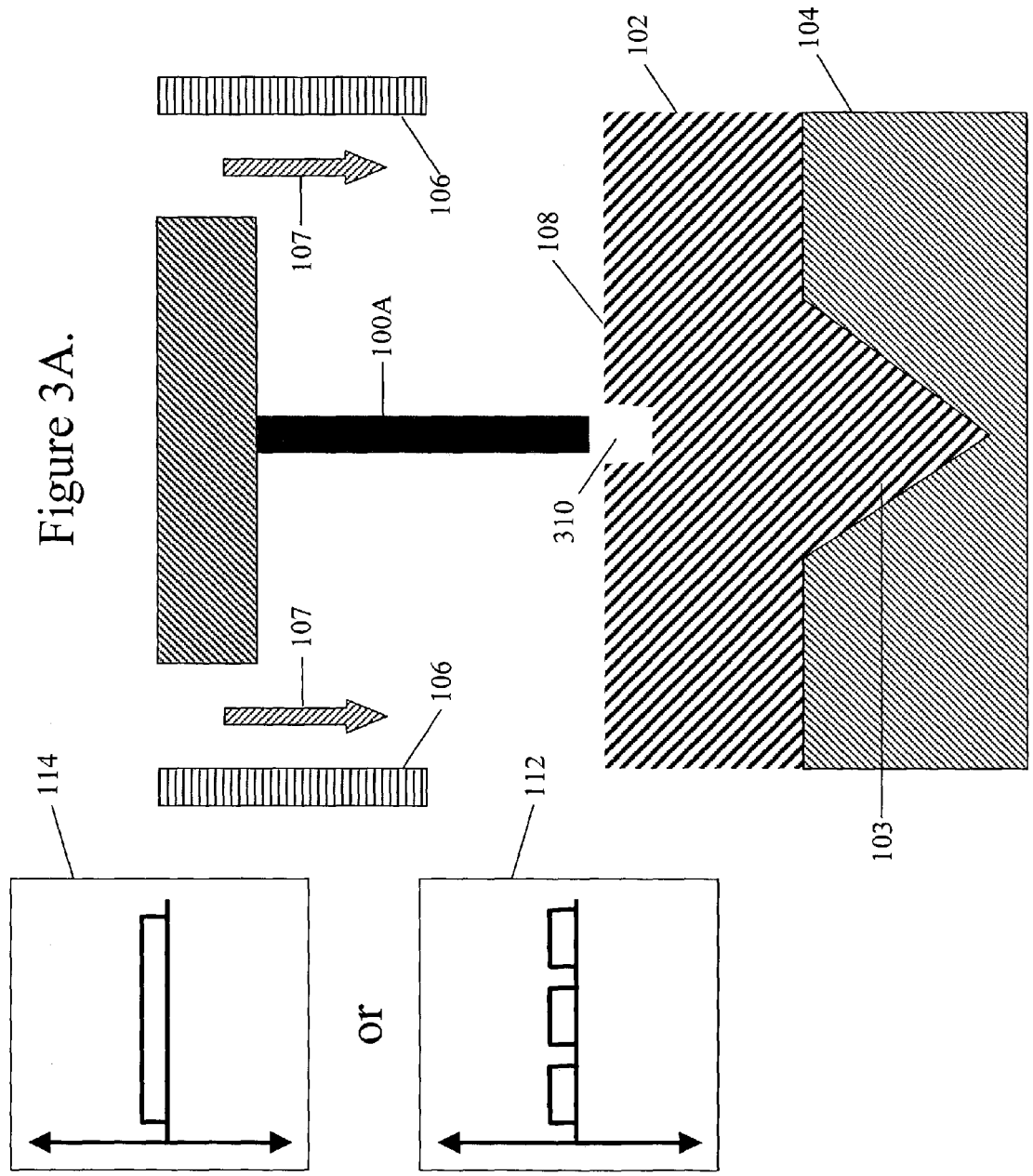
FIG. 3 illustrates electrode geometries that can be used in other embodiments of the invention.

As mentioned previously, different electrode end shapes may be employed in this process. FIG. 3A shows the effect achieved using a flat tipped electrode 100A and FIG. 3B shows the effect using a rounded or hemispherical tipped electrode 100B. In FIG. 3A, only the first and second phase are depicted, the recess 310 is approximately the shape of electrode 100A. In FIG. 3B, only the first and second phase are depicted, the recess 320 is approximately the shape of electrode 100B. FIGS. 3A and 3B illustrate the recesses formed in the electrodes after the first phase of the step and correspond to the first phase of the electrolytic step illustrated in FIG. 1B.

In accordance with an additional embodiment of the invention, prior to forming the recess and removing the overplate by the progressive radially inside-out etching procedure described above, the overplated layer is subjected to an electrolytic pretreatment to render the overplated layer more uniform or more planar and thus easier to etch without forming islands. In accordance with this embodiment, the overplated layer is treated to remove asperities as described in copending U.S. Pat. No. 6,558,231. In that process, the overplated layer is subjected to an electrolytic etching treatment to convert any macroasperities on the surface to microasperities using a wave sequence of short pulses similar to that described above for the second phase in the process of this invention, followed by an electrolytic etching treatment to remove the remaining microasperities using longer pulses similar to the pulses described for the third phase.

While the electrolytic steps used in the invention have been described as having three stages, those skilled in the art will appreciate that the electrolytic steps may be conducted in two or more stages under conditions which incrementally change from conditions favoring a geometric current distribution characterized by a low current or voltage to conditions favoring mass transfer characterized by a short transition time. Thus the early stages of each electrolytic step will typically favor a geometric distribution as contrasted with subsequent stage(s), which will favor mass transfer. In terms of $\tau$, the early stages will favor a higher $\tau$ whereas the subsequent stage(s) will favor a lower $\tau$. Additionally, in the mass transfer dependent phase of the process, initially a boundary layer having a macroprofile is favored while later in the process a boundary layer having a micro-profile is favored.

While the invention has been described in detail from a process involving two electrodes, those skilled in the art will recognize that the teachings herein will apply to any number of electrodes.

The invention having now been fully described, it should be understood that it might be embodied in other specific forms or variations without departing from its spirit or essential characteristics. Accordingly, the embodiments described above are to be considered in all respects as illustrative and not restrictive, the scope of the invention being indicated by the appended claims rather than the foregoing description, and all changes which come within the meaning and range of equivalency of the claims are intended to be embraced therein.

What is claimed:

1. A method for selectively removing a layer of electrolytically dissoluble metal such as copper overplate from a substrate such as a low-k dielectric comprising
    providing a substrate bearing on a major surface thereof a layer of electrolytically dissoluble metal, the metal layer serving as a dissoluble electrode and having a central region and an adjacent peripheral region;
    providing at least a first counterelectrode and a second counterelectrode;
    positioning the counterelectrodes opposite the metal layer and spaced from the metal layer and spaced from each other;
    in a first electrolytic step, passing an electric current between the first counterelectrode and the central region of the metal layer, wherein the first counterelectrode is cathodic with respect to the metal layer, and the first electrolytic step includes a first phase, a second phase, and a third phase and during the first phase the electric current is a low amperage current, during the second phase the electric current includes a train of anodic pulses having a short on time and a higher amperage than during the first phase, and during the third phase the current includes a train of higher amperage DC current or anodic pulses having a longer on time than the second phase, wherein during said first phase of the first electrolytic step removal of metal is confined to an area approximately the size of the counterelectrode and a depth that is less than the thickness of the metal layer, and during the second phase of the first electrolytic step the removal of the metal continues in a conformal manner to a predetermined depth, and during the third phase of the first electrolytic step the area of removal of metal is extended beyond the periphery of the area removed during said first phase and second phase of the first electrolytic step; and in a second electrolytic step, passing an electric current between the second counterelectrode and the peripheral region of the metal layer, wherein the second counterelectrode is maintained cathodic to the metal layer, and the second electrolytic step includes a first phase, a second phase, and a third phase and during the first phase the current is a low amperage current, during the second phase the current includes a train of anodic pulses having a short on time and a higher amperage than during the first phase, and during the third phase the electric current includes a train of the higher amperage DC current or anodic pulses having a longer on time than the second phase.

2. The method of claim 1 wherein during said first phase of the second electrolytic step removal of metal is confined to an area approximately the size of the counterelectrode and a depth that is less than the thickness of the metal layer, and during the second phase of the second electrolytic step the removal of the metal continues to a predetermined depth, and during the third phase of the first electrolytic step the area of removal of metal is extended beyond the periphery of the area removed during the first phase and second phase of the second electrolytic step that metal is removed throughout.

3. The method of claim 1, wherein said substrate has a generally circular shape, having a center.

4. The method of claim 3 wherein said first counterelectrode is positioned generally opposite said center of said substrate.

5. The method of claim 1 wherein said diameter of said first counterelectrode is not greater than about 10 millimeters.

6. The method of claim 1 wherein said diameter of said first counterelectrode is not greater than about 1 millimeter.

7. The method of claim 1 wherein said diameter of said first counterelectrode is not greater than about 100 micrometers.

8. The method of claim 1 wherein said diameter of said first counterelectrode is not greater than about 10 micrometers.

9. The method of claim 1, wherein the substrate has a center and in said first electrolytic step the interelectrode distance between said first counterelectrode and said metal layer is such that a majority of said electric current is collected at a region surrounding the center.

10. The method of claim 9 wherein essentially all of said electric current is collected by said central region of said metal layer.

11. The method of claim 9 wherein said interelectrode distance is not greater than about 10 millimeters.

12. The method of claim 9 wherein said interelectrode distance is not greater than about 1 millimeter.

13. The method of claim 9 wherein said interelectrode distance is not greater than about 100 micrometers.

14. The method of claim 9 wherein said interelectrode distance is not greater than about 10 micrometers.

15. The method of claim 10, wherein in said first electrolytic step said electrolyte is interposed only between said central region and said first counterelectrode.

16. The method of claim 1, wherein during the second phase of the electrolytic steps, said anodic pulses have an anodic on time no longer than about 100 microseconds.

17. The method of claim 1, wherein during the second phase of the electrolytic steps, said anodic pulses have an anodic on time no longer than about 10 microseconds.

18. The method of claim 16, wherein during the second phase of the electrolytic steps, said anodic pulses have a duty cycle ranging from about 1% to about 50%.

19. The method of claim 1, wherein pulses that are cathodic with respect to said metal layer are interposed between at least some of said anodic pulses in said pulse train, said cathodic pulse having a cathodic on time longer than said anodic on time of said anodic pulses and a cathodic current density less than said anodic current density of said anodic pulses, said anodic on time and said anodic current density of said anodic pulses and said cathodic on time and cathodic current density of said cathodic pulses being chosen so that said pulse train produces a net anodic removal of metal from said metal layer.

20. The method of claim 1, wherein said second counterelectrode is an annular electrode positioned generally concentrically with said first counterelectrode.

21. The method of claim 1, wherein said on time of said anodic pulses in the third phase of the first or second electrolytic steps ranges from about 10 nanoseconds to about 100 milliseconds.

22. The method of claim 21, wherein the duty cycle of said anodic pulses of the third phase of the first or second electrolytic steps is greater than 50%.

23. The method of claim 22, wherein pulses that are cathodic with respect to said metal layer are interposed between at least some of said anodic pulses of the third phase of the first and second electrolytic steps in said pulse train, said cathodic pulses having a cathodic on time shorter than said anodic on time of said anodic pulses and said anodic on time and said anodic current density of said anodic pulses and said cathodic on time and cathodic current density of said cathodic pulses being chosen so that said pulse train produces a net anodic removal of metal from said metal layer.

24. The method of claim 1 additionally comprising providing at least one additional counterelectrode and conducting at least one additional electrolytic step comprising, interposing an electrolyte between said metal layer and said additional counterelectrode and in electrical contact with said metal layer and said electrode, and passing an electric current between said additional counterelectrode and said metal layer, wherein said additional counterelectrode is maintained cathodic to said metal layer, for a period of time until said metal layer has been removed from an additional region of said surface of said substrate.

25. The method of claim 24 wherein said metal layer is progressively removed by providing a plurality of additional generally concentric ring annular counterelectrodes positioned radially outward of said second electrode, and sequentially activating each of said additional ring counterelectrodes by passing said electric current between each of said activated additional annular electrodes and said metal layer in radially outward sequence.

26. The method of claim 1 wherein the electric current used in the first phase of the first electrolytic step provides predominantly geometric current distribution.

27. The method of claim 26 wherein the electric current used in the first phase of the second electrolytic step provides predominantly geometric current distribution.

28. The method of claim 26 wherein the electric current used in the second phase of the first electrolytic step favors the conformal removal of the metal layer by mass transfer.

29. The method of claim 28 wherein the electric current used in the second phase of the second electrolytic step favors the conformal removal of the metal layer by mass transfer.

* * * * *